(12) United States Patent
Oh et al.

(10) Patent No.: US 9,209,050 B2
(45) Date of Patent: Dec. 8, 2015

(54) LASER CRYSTALLIZATION SYSTEM AND METHOD OF MANUFACTURING DISPLAY APPARATUS USING THE SAME

(71) Applicant: Samsung Display Co., Ltd., Yongin, Gyeonggi-do (KR)

(72) Inventors: Jae-Hwan Oh, Yongin (KR); Jae-Beom Choi, Yongin (KR); Won-Kyu Lee, Yongin (KR); Young-Jin Chang, Yongin (KR); Seong-Hyun Jin, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/184,114

(22) Filed: Feb. 19, 2014

(65) Prior Publication Data

US 2014/0183172 A1      Jul. 3, 2014

Related U.S. Application Data

(62) Division of application No. 13/272,114, filed on Oct. 12, 2011, now Pat. No. 8,673,751.

(30) Foreign Application Priority Data

Nov. 1, 2010      (KR) .................. 10-2010-0107713

(51) Int. Cl.
*H01L 27/14* (2006.01)
*H01L 21/67* (2006.01)
(Continued)

(52) U.S. Cl.
CPC .... *H01L 21/67115* (2013.01); *H01L 21/02422* (2013.01); *H01L 21/02488* (2013.01);
(Continued)

(58) Field of Classification Search
CPC ......... H01L 33/60; H01L 33/20; H01L 33/62; H01L 33/54; H01L 33/58; H01L 31/115
USPC .......................................... 257/98, 432, 428
See application file for complete search history.

(56) References Cited

U.S. PATENT DOCUMENTS 6,335,509 B1    1/2002  Jung
6,977,775 B2 *  12/2005  Sasaki et al. .................. 359/626
(Continued)

FOREIGN PATENT DOCUMENTS

JP       11-186163 A      7/1999
JP       2004-153150 A    5/2004
(Continued)

OTHER PUBLICATIONS

European Search Report dated Mar. 2, 2012 for European Patent Application No. EP 11 18 7301.4 which shares priority of Korean Patent Application No. KR 10-2010-00107713 with U.S. Appl. No. 13/272,114, the parent of captioned U.S. Appl. No. 14/184,114.
(Continued)

*Primary Examiner* — Quoc Hoang
(74) *Attorney, Agent, or Firm* — Knobbe, Martens, Olson & Bear, LLP

(57) ABSTRACT

A laser crystallization system is disclosed. In one embodiment, the laser crystallization system includes i) a mother substrate including first, second, and third display regions sequentially arranged in a first direction and ii) a stage for supporting the mother substrate and moving in the first direction and in a second direction. The system also includes i) a first laser irradiation unit for irradiating a first laser beam having a width greater than or identical to a width of a side of one of the display regions in the first direction and ii) a second laser irradiation unit spaced apart from the first laser irradiation unit and irradiating a second laser beam having a width greater than or identical to the width of the side in the first direction. Furthermore, the first and second laser beams may correspond to widths of sides of the first and third display regions.

11 Claims, 5 Drawing Sheets

(51) Int. Cl.
  *H01L 21/02* (2006.01)
  *H01L 27/32* (2006.01)
  *H01L 27/12* (2006.01)
(52) U.S. Cl.
  CPC .... *H01L21/02532* (2013.01); *H01L 21/02678* (2013.01); *H01L 21/02691* (2013.01); *H01L 27/1285* (2013.01); *H01L 27/3244* (2013.01); *H01L 2227/323* (2013.01)

(56) References Cited

U.S. PATENT DOCUMENTS

| | | | |
|---|---|---|---|
| 7,868,267 B2 * | 1/2011 | Tanaka | 219/121.6 |
| 8,003,499 B2 | 8/2011 | Tanaka | |
| 2003/0024905 A1 | 2/2003 | Tanaka | |
| 2005/0127045 A1 | 6/2005 | Sasaki et al. | |
| 2007/0201119 A1 | 8/2007 | Yamazaki | |
| 2007/0206150 A1 | 9/2007 | Woo et al. | |
| 2008/0062498 A1 | 3/2008 | Sasaki et al. | |

FOREIGN PATENT DOCUMENTS

| | | |
|---|---|---|
| JP | 2008-211093 A | 9/2008 |
| KR | 10-2005-0054444 A | 6/2005 |
| KR | 10-2005-0121549 A | 12/2005 |
| KR | 10-2008-0062779 A | 7/2008 |

OTHER PUBLICATIONS

European Examination Report dated Jul. 23, 2013 for European Patent Application No. EP 11 187 301.4 which shares priority of Korean Patent Application No. KR 10-2010-0107713 with U.S. Appl. No. 13/272,114, the parent of captioned U.S. Appl. No. 14/184,114.

European Examination Report dated May 6, 2015 for European Patent Application No. EP 11 187 301.4 which shares priority of Korean Patent Application No. KR 10-2010-0107713 with captioned U.S. Appl. No. 14/184,114.

\* cited by examiner

LASER CRYSTALLIZATION SYSTEM AND METHOD OF MANUFACTURING DISPLAY APPARATUS USING THE SAME

CROSS-REFERENCE TO RELATED PATENT APPLICATION

This application is a divisional application of U.S. application Ser. No. 13/272,114, filed on Oct. 12, 2011, which is incorporated by reference in its entirety. This application claims the benefit of Korean Patent Application No. 10-2010-00107713, filed on Nov. 1, 2010, in the Korean Intellectual Property Office, the disclosure of which is incorporated herein in its entirety by reference.

BACKGROUND

1. Field

The described technology generally relates to a laser crystallization system and a method of manufacturing a display apparatus using the laser crystallization system, and more particularly, to a laser crystallization system for improving characteristics of an active layer and easily forming the active layer, and a method of manufacturing a display apparatus using the laser crystallization system.

2. Description of the Related Technology

Recently, display devices have been replaced with portable thin film type flat displays. From among these flat displays, an organic light-emitting display, which is self emissive, has a large viewing angle, good contrast characteristics, fast response speeds, and good brightness characteristics and requires a low driving voltage, and has thus drawn attention as the next-generation display.

Such displays include active layers that are generally formed by forming amorphous semiconductor layers, performing a crystallization process on the amorphous semiconductor layers, and patterning the crystallized amorphous semiconductor layers. The crystallization process may be performed by using various methods, and mainly by using laser.

Flat panel displays are generally formed in a plurality of display regions formed on mother substrates for manufacturing process convenience. Sizes of mother substrates have recently increased according to demands for manufacturing efficiency and large-quantities of display devices.

However, a process of crystallizing an amorphous semiconductor layer of a display region formed on a large-sized mother substrate is not easily performed, which restricts forming active layers having desired characteristics.

SUMMARY

One inventive aspect is a laser crystallization system for improving characteristics of an active layer and easily forming the active layer, and a method of manufacturing a display apparatus using the laser crystallization system.

Another aspect is a laser crystallization system including: a mother substrate in which first, second, and third display regions in which amorphous semiconductor layers are formed are sequentially arranged in a first direction; a stage for supporting the mother substrate and moving in the first direction and in a second direction perpendicular to the first direction; a first laser irradiation unit for irradiating a first laser beam having a width greater than or identical to a width of a side of one of the first, second, and third display regions in the first direction; and a second laser irradiation unit being spaced apart from the first laser irradiation unit and irradiating a second laser beam having a width greater than or identical to the width of the side of one of the first, second, and third display regions in the first direction, wherein the first laser beam corresponds to a width of a side of the first display region in the first direction, and the second laser beam corresponds to a width of a side of the third display region in the first direction.

The first laser irradiation unit may include a first shutter unit, the second laser irradiation unit comprises a second shutter unit, the width of the first laser beam is controlled by the first shutter unit, and the width of the second laser beam is controlled by the second shutter unit.

The amorphous semiconductor layers may be crystallized by moving the stage in the second direction while the first laser irradiation unit and the second laser irradiation unit are fixed.

The mother substrate may be an eighth generation substrate having a width of 2500 mm in one direction, and a width of 2200 mm in another direction.

The mother substrate may be an eighth generation substrate having a width of 2200 mm in the first direction, and a width of 2500 mm in the second direction, and each of the first, second, and third display regions has a size suitable for forming a 55 inch display apparatus.

The laser crystallization system may further include: fourth, fifth, and sixth display regions, wherein the fourth display region is disposed in parallel with the first display region in the second direction, the fifth display region is disposed in parallel with the second display region in the second direction, and the sixth display region is disposed in parallel with the third display region in the second direction.

The mother substrate may be an eighth generation substrate having a width of 2500 mm in the first direction, and a width of 2200 mm in the second direction, and each of the first, second, and third display regions has a size suitable for forming a 46 inch display apparatus.

The laser crystallization system may further include: fourth, fifth, sixth, seventh, and eighth display regions, wherein the fourth display region is disposed in parallel with the third display region in the first direction, the fifth display region is disposed in parallel with the first display region in the second direction, the sixth display region is disposed in parallel with the second display region in the second direction, the seventh display region is disposed in parallel with the third display region in the second direction, and the eighth display region is disposed in parallel with the fourth display region in the second direction.

A plurality of crystallization processes may be performed by maintaining a gap between the first laser irradiation unit and the second laser irradiation unit.

Another aspect is a method of manufacturing a display apparatus, the method including: preparing a mother substrate in which at least first, second, and third display regions in which amorphous semiconductor layers are formed are sequentially arranged in a first direction; disposing the mother substrate on a stage that moves in the first direction and in a second direction perpendicular to the first direction; forming an active layer by moving the stage in the second direction, irradiating a first laser beam corresponding to a width of a side of the first display region in the first direction from a first laser irradiation unit disposed on an upper portion of the mother substrate, irradiating a second laser beam corresponding to a width of a side of the third display region in the first direction from a second laser irradiation unit disposed on the upper portion of the mother substrate, and crystallizing the amorphous semiconductor layers of the first display region and the third display region; and forming the display device on an upper portion of the active layer.

A width of the first laser beam may be controlled by a first shutter unit included in the first laser irradiation unit, and a width of the second laser beam may be controlled by a second shutter unit included in the second laser irradiation unit.

The crystallizing of the amorphous semiconductor layers may include: moving the stage in the second direction while the first laser irradiation unit and the second laser irradiation unit are fixed.

The method may further include: after crystallizing the amorphous semiconductor layers of the first display region and the third display region, moving the stage in the first direction, disposing the first laser beam or the second laser beam to correspond to the second display region, moving the stage in the second direction, and crystallizing the amorphous semiconductor layer of the second display region.

The mother substrate may be an eighth generation substrate having a width of 2500 mm in one direction, and a width of 2200 mm in another direction.

The mother substrate may be an eighth generation substrate having a width of 2200 mm in the first direction, and a width of 2500 mm in the second direction, and each of the first, second, and third display regions has a size suitable for forming a 55 inch display apparatus.

The method may further include: fourth, fifth, and sixth display regions, wherein the fourth display region is disposed in parallel with the first display region in the second direction, the fifth display region is disposed in parallel with the second display region in the second direction, and the sixth display region is disposed in parallel with the third display region in the second direction, wherein the amorphous semiconductor layers of the fourth display region and the sixth display region are crystallized by continuously moving the stage in the second direction after crystallizing the amorphous semiconductor layers of the first display region and the third display region.

The method may further include: after crystallizing the amorphous semiconductor layers of the first display region, the third display region, the fourth display region, and the sixth display region, moving the stage in the first direction, disposing the first laser beam or the second laser beam to correspond to the second display region, moving the stage in the second direction, crystallizing the amorphous semiconductor layer of the second display region, continuously moving the stage in the second direction, and crystallizing the amorphous semiconductor layer of the fifth display region.

The mother substrate may be an eighth generation substrate having a width of 2500 mm in the first direction, and a width of 2200 mm in the second direction, and each of the first, second, and third display regions has a size suitable for forming a 46 inch display apparatus.

The method may further include: fourth, fifth, sixth, seventh, and eighth display regions, wherein the fourth display region is disposed in parallel with the third display region in the first direction, wherein the fifth display region is disposed in parallel with the first display region in the second direction, the sixth display region is disposed in parallel with the second display region in the second direction, the seventh display region is disposed in parallel with the third display region in the second direction, and the eighth display region is disposed in parallel with the fourth display region in the second direction, wherein the amorphous semiconductor layers of the fifth display region and the seventh display region are crystallized by continuously moving the stage in the second direction after crystallizing the amorphous semiconductor layers of the first display region and the third display region.

The method may further include: after crystallizing the amorphous semiconductor layers of the first display region, the third display region, the fifth display region, and the seventh display region, moving the stage in the first direction, disposing the first laser beam and the second laser beam to correspond to the second display region and the fourth display region, respectively, moving the stage in the second direction, crystallizing the amorphous semiconductor layers of the second display region and the fourth display region, continuously moving the stage in the second direction, and crystallizing the amorphous semiconductor layers of the sixth display region and the eighth display region.

A plurality of crystallization processes may be performed by maintaining a gap between the first laser irradiation unit and the second laser irradiation unit.

DETAILED DESCRIPTION

Embodiments will now be described more fully with reference to the accompanying drawings.

Figure 1:
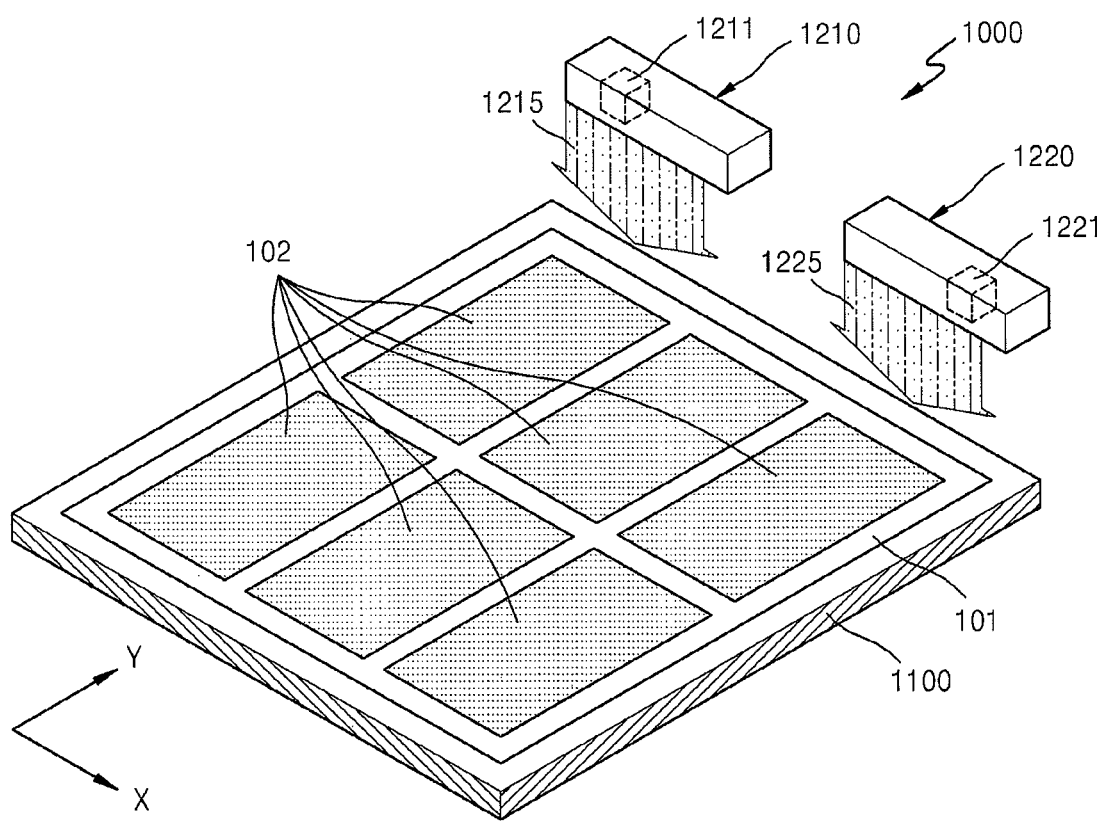
FIG. 1 is a schematic perspective view illustrating a laser crystallization system and a mother substrate crystallized by using the laser crystallization system, according to an embodiment.
Figure 2:
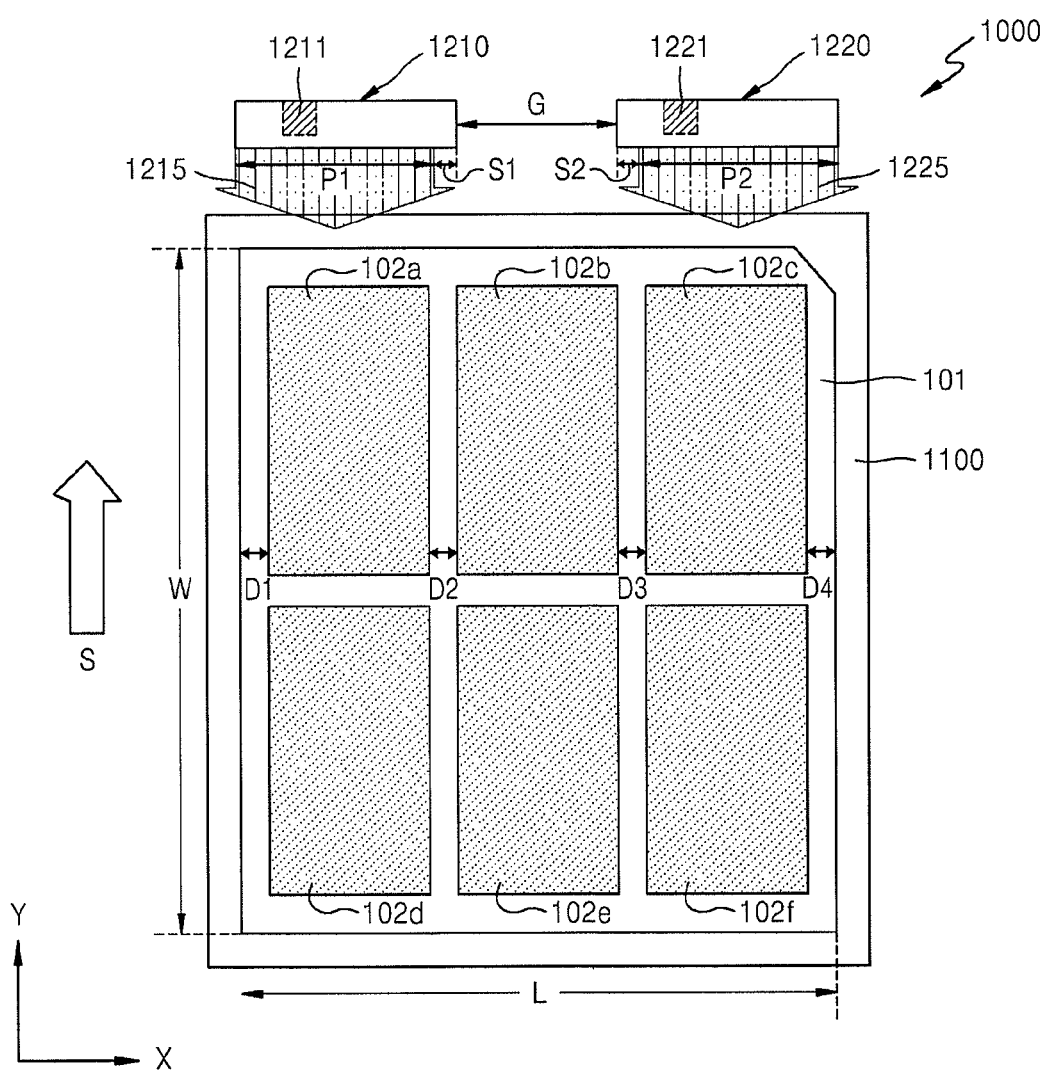
FIG. 2 is a plan view illustrating the mother substrate of FIG. 1.

FIG. 1 is a schematic perspective view illustrating a laser crystallization system 1000 and a mother substrate 101 crystallized by using the laser crystallization system, according to an embodiment. FIG. 2 is a plan view illustrating the mother substrate 101 of FIG. 1.

Referring to FIGS. 1 and 2, the laser crystallization system 1000 includes the mother substrate 101, a stage 1100, a first laser irradiation unit 1210, and a second laser irradiation unit 1220.

The stage 1100 includes a driving unit (not shown) so that the stage 1100 is driven in a first direction (e.g., in a direction X of FIG. 1) and in a second direction (e.g., in a direction Y of FIG. 1).

The mother substrate 101 is disposed on the stage 1100. In one embodiment, the mother substrate 101 has an eighth generation size to manufacture six 55 inch display apparatuses in a single process. In this embodiment, a length L of the first direction of the mother substrate 101 is about 2200 mm, and a width W of the second direction of the mother substrate 101 is about 2500 mm.

The mother substrate 101 may be formed of transparent glass of which a main component is $SiO_2$. However, the mother substrate 101 is not limited thereto. For example, the mother substrate 101 may be formed of a transparent plastic. In this regard, the plastic material used for forming the mother substrate 101 may be an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

The mother substrate 101 includes a plurality of display regions 102a, 102b, 102c, 102d, 102e, and 102f. Although not shown, amorphous semiconductor layers are formed on the display regions 102a-102f. More specifically, the amorphous semiconductor layers may contain amorphous silicon.

The display regions 102a-102f correspond to a plurality of display apparatuses that will be formed through a subsequent process. That is, each of the display apparatuses that are finally formed through the subsequent process includes one of the display regions 102a-102f. Each display apparatus includes circuit units (not shown) that will be formed in spaces D1, D2, D3, and D4 between the display regions 102a-102f. Each display apparatus is divided by cutting predetermined regions of the spaces D1-D4.

Widths of the spaces D1-D4 may be determined according to process conditions.

The display regions 102a-102f are defined as the first display region 102a, the second display region 102b, the third display region 102c, the fourth display region 102d, the fifth display region 102e, and the sixth display region 102f.

The first display region 102a, the second display region 102b, and the third display region 102c are sequentially arranged on the upper area of the mother substrate 101 in the first direction. The fourth display region 102d, the fifth display region 102e, and the sixth display region 102f are sequentially arranged on the lower area of the mother substrate 101 in the second direction. The first display region 102a and the fourth display region 102d are disposed substantially in parallel with each other in the second direction. The second display region 102b and the fifth display region 102e are disposed substantially in parallel with each other in the second direction. The third display region 102c and the sixth display region 102f are disposed substantially in parallel with each other in the second direction.

In one embodiment, all of the display regions 102a-102f have substantially the same shape and size. In one embodiment, each of the display regions 102a-102f has a shape and size corresponding to a 55 inch display apparatus.

For example, the length of the first display region 102a in the first direction may be about 703 mm, and the width of the first display region 102a in the second direction may be about 1232.8 mm. In another embodiment, the length and the width may slightly differ according to design criteria of a circuit region to be formed around the first display region 102a.

In one embodiment, the second to fifth display regions 102b-102f are formed to have substantially the same size as the first display region 102a.

The first laser irradiation unit 1210 and the second laser irradiation unit 1220 are disposed on the mother substrate 101. The first and second laser irradiation units 1210 and 1220 are spaced apart from each other by a gap G. The first laser irradiation unit 1210 includes a first shutter unit 1211. The second laser irradiation unit 1220 includes a second shutter unit 1221.

The first laser irradiation unit 1210 irradiates a first laser beam 1215 toward the first display region 102a. The first laser beam 1215 has a width P1 in the first direction. The width P1 of the first laser beam 1215 is obtained by reducing a width S1 by the first shutter unit 1211. That is, the maximum beam width of the first laser irradiation unit 1210 is S1+P1. The maximum beam width S1+P1 is about 740 mm.

Furthermore, the size of the width S1 may be controlled by the first shutter unit 1211 in various ways. Although a right-side width of the first laser beam 1215 is reduced due to the first shutter unit 1211 in FIG. 2, a left-side width of the first laser beam 1215 may be reduced due to the first shutter unit 1211.

The second laser irradiation unit 1220 irradiates a second laser beam 1225 toward the third display region 102c. The second laser beam 1225 has a width P2 in the first direction. The width P2 of the second laser beam 1225 is obtained by reducing a width S2 by the second shutter unit 1221. That is, the maximum beam width of the second laser irradiation unit 1220 is S2+P2. The maximum beam width S2+P2 is about 740 mm.

Furthermore, the size of the width S2 may be controlled by the second shutter unit 1221 in various ways. Although a left-side width of the second laser beam 1225 is reduced due to the second shutter unit 1221 in FIG. 2, a right-side width of the second laser beam 1225 may be reduced due to the second shutter unit 1221.

The width P1 of the first laser beam 1215 is greater than the width of the first display region 102a in the first direction. For example, the width P1 of the first laser beam 1215 is greater than about 703 mm.

Furthermore, the first laser irradiation unit 1210 is controlled in such a way that the first laser beam 1215 substantially overlaps with the entire width of the first display region 102a in the first direction.

In one embodiment, the width P2 of the second laser beam 1225 is greater than the width of the third display region 102c in the first direction. For example, the width P2 of the second laser beam 1225 is greater than about 703 mm.

Furthermore, the second laser irradiation unit 1220 is controlled in such a way that the second laser beam 1225 substantially overlaps with the entire width of the third display region 102c in the first direction.

The first laser irradiation unit 1210 and the second laser irradiation unit 1220 are spaced apart from each other by the gap G. The gap G may be approximately about 650 mm.

In one embodiment, the first laser beam 1215 and the second laser beam 1225 are not irradiated onto the second display region 102b disposed between the first display region 102a and the third display region 102c by the gap G and the first shutter unit 1211 and the second shutter unit 1221.

The first laser irradiation unit 1210 and the second laser irradiation unit 1220 may be fixed and move the stage 1100 in a scan direction S, i.e. in the second direction. For example, the first laser beam 1215 sequentially crystallizes the amorphous semiconductor layers formed on the first display region 102a and the fourth display region 102d. Furthermore, the second laser beam 1225 that is substantially simultaneously irradiated with the first laser beam 1215 sequentially crystallizes the amorphous semiconductor layers formed on the third display region 102c and the sixth display region 102f. That is, when the stage 1100 moves, a crystallization process is substantially simultaneously performed in the first display region 102a and the third display region 102c, and is substantially simultaneously performed in the fourth display region 102d and the sixth display region 102f.

The crystallization process is performed in the second display region 102b and the fifth display region 102e after moving the stage 1100 in the first direction, arranging the first laser beam 1215 or the second laser beam 1225 to correspond to the second display region 102b, and moving the stage 1100 in the scan direction S. In this regard, the first laser beam 1215 or the second laser beam 1225 that does not correspond to the second display region 102b may be shut off by using a shutter unit.

Figure 3:
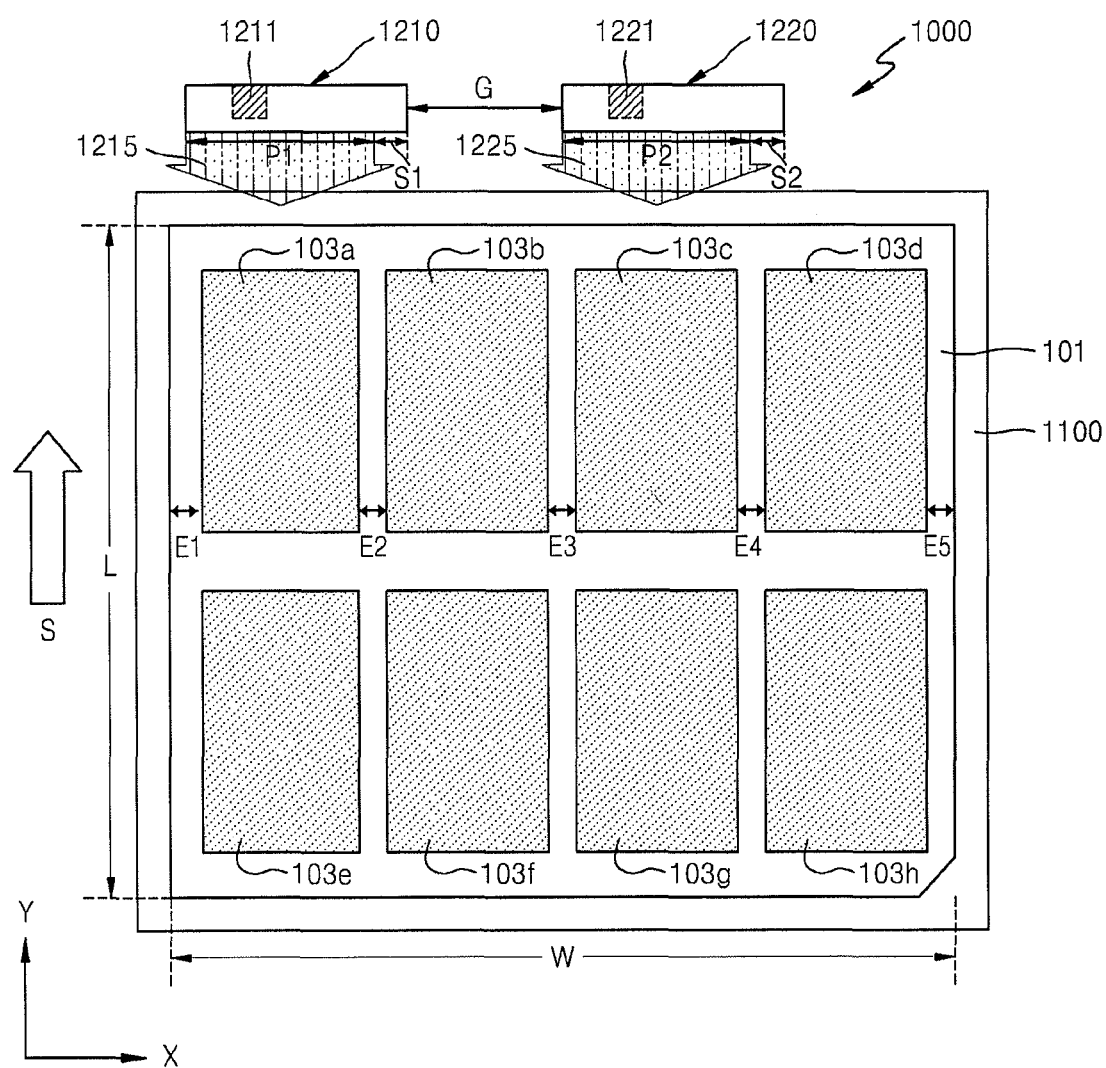
FIG. 3 is a plan view illustrating a mother substrate crystallized by using the laser crystallization system of FIG. 1, according to another embodiment.

FIG. 3 is a plan view illustrating the mother substrate 101 crystallized by using the laser crystallization system 1000 of FIG. 1, according to another embodiment.

Referring to FIG. 3, the laser crystallization system 1000 is the same as the laser crystallization system 1000 of FIG. 1, except that the first shutter unit 1211 and the second shutter unit 1221 are different from those described with reference to FIGS. 1 and 2. More specifically, the size of the width S1 of a beam that is reduced by the first shutter unit 1211 of FIG. 3, and the size and position of the width S2 of the beam that is reduced by the second shutter unit 1221 are different from those described with reference to FIGS. 1 and 2.

The mother substrate 101 is disposed on the stage 1100. In one embodiment, the mother substrate 101 has an eighth generation size to manufacture eight 46 inch display apparatuses in a single process, and is substantially the same size as the mother substrate 101 of FIGS. 1 and 2. In this embodiment, the mother substrate 101 is obtained by rotating the mother substrate 101 of FIGS. 1 and 2, wherein, a width W of a first direction of the mother substrate 101 is about 2500 mm, and a length L of a second direction of the mother substrate 101 is about 2200 mm.

The mother substrate 101 includes a plurality of display regions 103a-103h. Although not shown, amorphous semiconductor layers are formed on the display regions—103h. More specifically, the amorphous semiconductor layers may contain amorphous silicon.

The display regions 103a-103h correspond to a plurality of display apparatuses to be formed through a subsequent process. That is, each of the display apparatuses that are finally formed through the subsequent process includes one of the display regions 103a-103h. Each display apparatus includes circuit units (not shown) to be formed in spaces E1-E5 between the display regions 103a-103h. Each display apparatus is divided by cutting predetermined regions of the spaces E1-E5. Widths of the spaces E1-E5 may be determined according to process conditions.

The display regions 103a-103h are defined as the first display region 103a, the second display region 103b, the third display region 103c, the fourth display region 103d, the fifth display region 103e, the sixth display region 103f, the seventh display region 103g, and the eighth display region 103h.

The first to fourth display regions 103a-103d are sequentially arranged on the upper area of the mother substrate 101 in the first direction. The fifth to eighth display regions 103e-103h are sequentially arranged on the lower area of the mother substrate 101 in the first direction. The first display region 103a and the fifth display region 103e are disposed substantially in parallel with each other in the second direction. The second display region 103b and the sixth display region 103f are disposed substantially in parallel with each other in the second direction. The third display region 103c and the seventh display region 103g are disposed substantially in parallel with each other in the second direction. The fourth display region 103d and the eighth display region 103h are disposed substantially in parallel with each other in the second direction.

In one embodiment, all of the display regions 103a-103h have substantially the same shape and size. In one embodiment, each of the display regions 103a-103h has a shape and size corresponding to a 46 inch display apparatus.

For example, the length of the first display region 103a in the first direction may be about 591.3 mm, and the width of the first display region 103a in the second direction may be about 1041.35 mm. In another embodiment, the length and the width may slightly differ according to design criteria of a circuit region to be formed around the first display region 103a.

In one embodiment, the second to eighth display regions 103b-103h are formed to have substantially the same size as the first display region 103a.

The first laser irradiation unit 1210 and the second laser irradiation unit 1220 are disposed on the mother substrate 101. The first laser irradiation unit 1210 and the second laser irradiation unit 1220 are spaced apart from each other by the gap G that is the same as shown in FIG. 1. For example, the gap G is approximately about 650 mm, as described above.

The first laser irradiation unit 1210 irradiates the first laser beam 1215 toward the first display region 103a. The first laser beam 1215 has the width P1 in the first direction. The width P1 of the first laser beam 1215 is obtained by reducing the width S1 by the first shutter unit 1211. The width P1 of the first laser beam 1215 is smaller than the width P1 of the first laser beam 1215 of FIGS. 1 and 2. That is, the width S1 of the first shutter unit 1211 is greater than the width S1 of FIGS. 1 and 2.

That is, the maximum beam width of the first laser irradiation unit 1210 is S1+P1 which is the same as shown in FIGS. 1 and 2. The maximum beam width S1+P1 is about 740 mm.

Furthermore, the size of the width S1 may be controlled in various ways by the first shutter unit 1211. Although a right-side width of the first laser beam 1215 is reduced due to the first shutter unit 1211 in FIG. 3, a left-side width of the first laser beam 1215 may be reduced due to the first shutter unit 1211.

The second laser irradiation unit 1220 irradiates the second laser beam 1225 toward the third display region 103c. The second laser beam 1225 has the width P2 in the first direction. The width P2 of the second laser beam 1225 is obtained by reducing the width S2 by the second shutter unit 1221. The width P2 of the second laser beam 1225 is smaller than the width P2 of the second laser beam 1225 of FIGS. 1 and 2. That is, the width S2 of the second shutter unit 1221 is greater than the width S2 of FIGS. 1 and 2.

The maximum beam width of the second laser irradiation unit 1220 is S2+P2, which is the same as shown in FIGS. 1 and 2. The maximum beam width S2+P2 is about 740 mm.

Furthermore, the size of the width S2 may be controlled by the second shutter unit 1221 in various ways. Although a right-side width of the second laser beam 1225 is reduced due to the second shutter unit 1221 in FIG. 3, a left-side width of the second laser beam 1225 may be reduced due to the second shutter unit 1221.

The width P1 of the first laser beam 1215 is greater than the width of the first display region 103a in the first direction. For example, the width P1 of the first laser beam 1215 is greater than about 591.3 mm.

Furthermore, the first laser irradiation unit 1210 is controlled in such a way that the first laser beam 1215 overlaps the entire width of the first display region 103a in the first direction.

The width P2 of the second laser beam 1225 is greater than the width of the third display region 103c in the first direction. For example, the width P2 of the second laser beam 1225 is greater than about 591.3 mm.

Furthermore, the second laser irradiation unit 1220 is controlled in such a way that the second laser beam 1225 overlaps the entire width of the third display region 103c in the first direction.

The first laser beam 1215 and the second laser beam 1225 are not irradiated onto the second display region 103b disposed between the first display region 103a and the third display region 103c by the gap G and the first shutter unit 1211 and the second shutter unit 1221.

The first laser irradiation unit 1210 and the second laser irradiation unit 1220 are fixed and move the stage 1100 in a scan direction S, i.e. in the second direction. Accordingly, the first laser beam 1215 sequentially crystallizes the amorphous semiconductor layers formed on the first display region 103a and the fifth display region 103e. Furthermore, the second laser beam 1225 that is substantially simultaneously irradiated with the first laser beam 1215 sequentially crystallizes the amorphous semiconductor layers formed on the third display region 103c and the seventh display region 103g. That is, when the stage 1100 moves, a crystallization process is substantially simultaneously performed in the first display region 103a and the third display region 103c, and is substantially simultaneously performed in the fifth display region 103e and the seventh display region 103g.

The crystallization process is performed in the second display region 103b and the fourth display region 103d after moving the stage 1100 in the first direction, arranging the first laser beam 1215 and the second laser beam 1225 to correspond to the second display region 103b and the fourth display region 103d, respectively, and moving the stage 1100 in the scan direction S, i.e. in the second direction.

The laser crystallization system 1000 of the present embodiment is used to continuously perform the crystallization process by irradiating a beam having a width corresponding to a width of one side of each display region formed on the mother substrate 101, thereby improving characteristics of a crystallized semiconductor layer. Furthermore, the crystallized semiconductor layer having uniform characteristics is easily formed.

The crystallization process is performed by substantially simultaneously irradiating the first laser beam 1215 and the second laser beam 1225, thereby improving process convenience.

The crystallization process is performed by moving the stage 1100 on which the mother substrate 101 is disposed, while the first laser beam 1210 and the second laser beam 1220 that are not easily controlled are fixed, thereby increasing improvement of the characteristics of the crystallized semiconductor layer.

In particular, the first laser beam 1210 and the second laser beam 1220 are fixed apart from each other by the gap G. The first laser beam 1210 and the second laser beam 1220 include the first shutter unit 1211 and the second shutter unit 1221, respectively. The one laser crystallization system 1000 can perform a crystallization process for forming a 55 inch display apparatus and a crystallization process for forming a 46 inch display apparatus in an eighth generation mother substrate by fixing the first laser beam 1210 and the second laser beam 1220 that are spaced apart from each other by the gap G and controlling the first shutter unit 1211 and the second shutter unit 1221. The crystallization processes for forming the display apparatuses having the two different sizes are performed without moving the first laser beam 1210 and the second laser beam 1220, thereby preventing a variation of a laser beam due to the movements of the first laser beam 1210 and the second laser beam 1220, and a reduction of the crystallization characteristics caused by the variation of the laser beam.

Accordingly, a process of manufacturing display apparatuses of various sizes is easy in the eighth generation mother substrate that is a next-generation mother substrate for forming a large-sized display apparatus.

Figure 4:
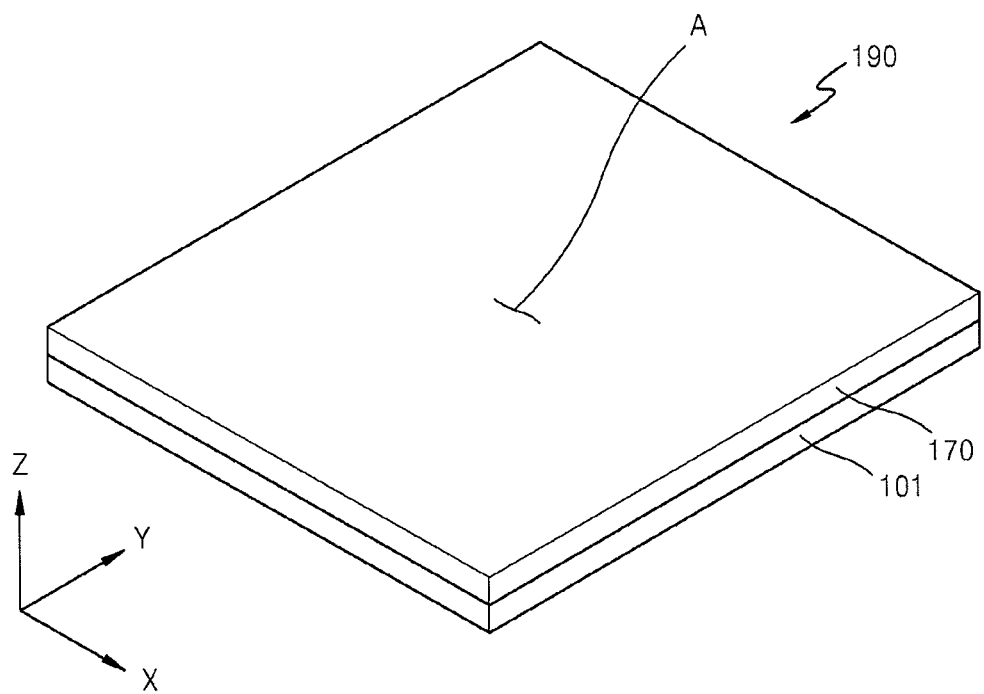
FIG. 4 is a schematic perspective view illustrating a mother panel for a finally manufactured display apparatus after performing a crystallization process by using the laser crystallization system of FIG. 1, according to an embodiment.
Figure 5:
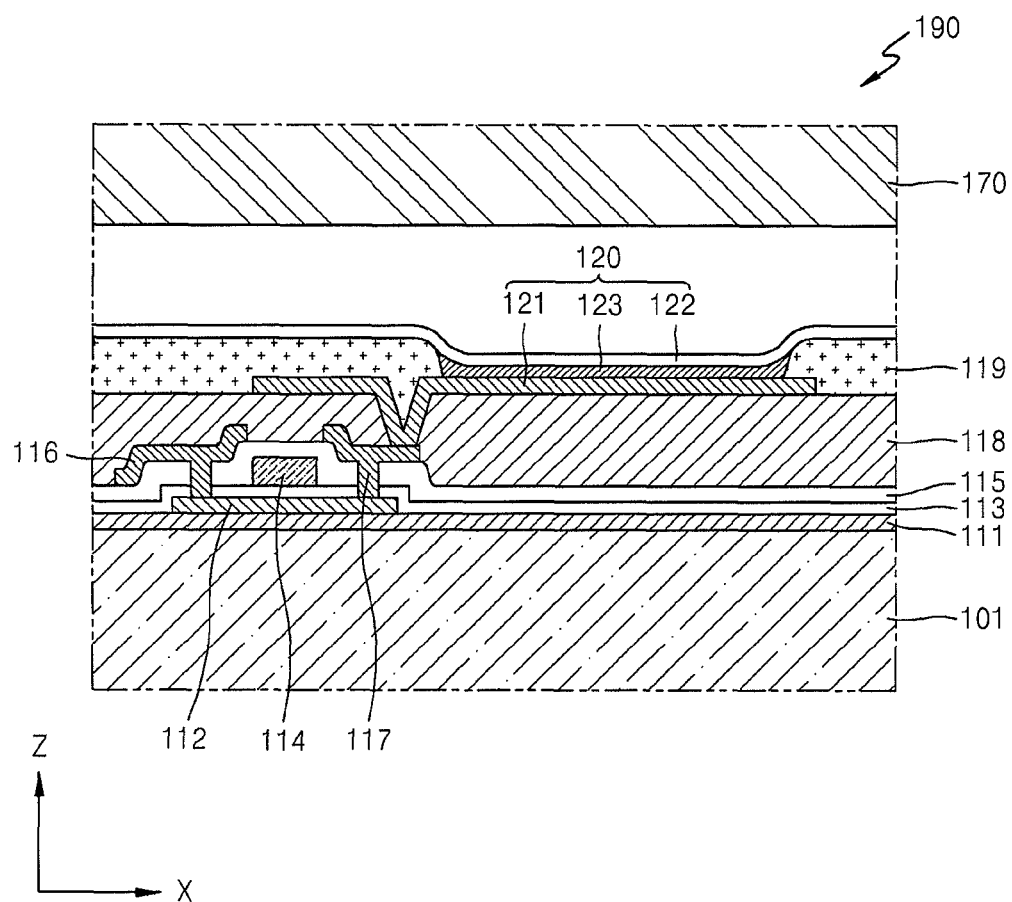
FIG. 5 is a cross-sectional view of the mother panel taken along line A of FIG.

FIG. 4 is a schematic perspective view illustrating the mother panel 190 for a finally manufactured display apparatus after performing a crystallization process by using the laser crystallization system of FIG. 1, according to an embodiment. FIG. 5 is a cross-sectional view of the mother panel 190 taken along line A of FIG. 4.

Referring to FIGS. 4 and 5, a buffer layer 111 is formed on the mother substrate 101 before an amorphous silicon layer is formed thereon. The buffer layer 111 may contain $SiO_2$ or $SiN_x$. The buffer layer 111 provides an upper portion of the mother substrate 101 with a planar surface, and prevents moisture and impurities from permeating into the mother substrate 101.

An active layer 112 having a predetermined pattern is formed on the buffer layer 111. The active layer 112 is formed by forming the amorphous silicon layer and crystallizing the amorphous silicon layer by using the laser crystallization system 1000 as described above.

A gate insulation layer 113 is formed on an upper portion of the active layer 112. A gate electrode 114 is formed in a predetermined region of an upper portion of the gate insulation layer 113. The gate electrode 114 may be formed of a metal or a metal alloy, such as Au, Ag, Cu, Ni, Pt, Pd, Al, Mo, or an Al:Nd alloy, an Mo:W alloy, etc., but the present invention is not limited thereto.

An interlayer insulation layer 115 is formed on an upper portion of the gate electrode 114 through which a predetermined region of the active layer 112 is exposed. A source electrode 116 and a drain electrode 117 are formed to contact the exposed region of the active layer 112.

A passivation layer 118 is formed to cover the source electrode 116 and the drain electrode 117. An organic light emitting device 120 is formed on the passivation layer 118. Although the organic light emitting device 120 is used as a display device in the present embodiment, a variety of display devices including a liquid crystal device, etc. may be used.

The organic light emitting device 120 includes a first electrode 121, a second electrode 122, and an intermediate layer 123.

More specifically, the first electrode 121 is formed on the passivation layer 118. The passivation layer 118 is formed to expose the drain electrode 117. The first electrode 121 is electrically connected to the exposed drain electrode 117.

A pixel definition layer 119 is formed on the first electrode 121. The pixel definition layer 119 includes a variety of insulation materials and is formed to expose a predetermined region of the first electrode 121.

The intermediate layer 123 is formed on the first electrode 121. The intermediate layer 123 includes an organic emission layer (not shown) that generates visible light. The second electrode 122 is formed on the intermediate layer 123. If a voltage is applied through the first electrode 121 and the second electrode 122, the visible light is realized in the organic emission layer of the intermediate layer 123.

A sealing member 170 is disposed on the second electrode 122 and thus the mother panel 190 for the display device is finally formed. Although not shown, six 55 inch display apparatuses or eight 46 inch display apparatuses can be formed by cutting the mother panel 190 for the display apparatus.

The sealing member 170 is formed to protect the intermediate layer 123 and the other layers from external moisture or oxygen and is formed of a transparent material. To this end, the sealing member 170 may include glass, plastic, or a plurality of stacked layers including organic and inorganic materials.

Although the sealing member 170 is spaced apart from the second electrode 122 in FIG. 5, the sealing member 170 and the second electrode 122 may contact each other.

The active layer 112 of the present embodiment is formed by using the laser crystallization system 1000 and has uniform characteristics throughout the mother panel 190 for the display apparatus. Furthermore, a crystallization process is continuously performed while the first laser irradiation unit 1210 and the second laser irradiation unit 1220 that irradiate a laser beam are fixed, and thus the active layer 112 has continuous and improved electrical characteristics.

As described above, according to the laser crystallization system and a method of manufacturing a display apparatus using the laser crystallization system, characteristics of an active layer are improved and the active layer is easily formed.

While the disclosed embodiments have been shown and described with reference to the accompanying drawings, it will be understood by those of ordinary skill in the art that various changes in form and details may be made therein without departing from the spirit and scope of the following claims.

What is claimed is:

1. A laser crystallization system comprising:
    a mother substrate in which first, second, and third display regions are sequentially arranged in a first direction, wherein amorphous semiconductor layers are formed in each of the display regions;
    a stage configured to support the mother substrate and move in the first direction and in a second direction substantially perpendicular to the first direction;
    a first laser irradiation unit configured to irradiate a first laser beam having a width greater than or substantially identical to the width of a side of one of the first, second, and third display regions in the first direction; and
    a second laser irradiation unit being spaced apart from the first laser irradiation unit and configured to irradiate a second laser beam having a width greater than or substantially identical to the width of the side of one of the first, second, and third display regions in the first direction,
    wherein the first laser beam corresponds to the width of a side of the first display region in the first direction, and wherein the second laser beam corresponds to the width of a side of the third display region in the first direction.

2. The laser crystallization system of claim 1, wherein the first laser irradiation unit comprises a first shutter unit configured to control the width of the first laser beam, and wherein the second laser irradiation unit comprises a second shutter unit configured to control the width of the second laser beam.

3. The laser crystallization system of claim 1, wherein the first and second laser irradiation units are configured to crystallize the amorphous semiconductor layers by moving the stage in the second direction while the laser irradiation units are fixed.

4. The laser crystallization system of claim 1, wherein the mother substrate is an eighth generation substrate having a width of about 2500 mm in one direction, and a width of about 2200 mm in another direction.

5. The laser crystallization system of claim 1, wherein the mother substrate is an eighth generation substrate having a width of about 2200 mm in the first direction, and a width of about 2500 mm in the second direction, and wherein each of the first, second, and third display regions has a size suitable for forming a 55 inch display apparatus.

6. The laser crystallization system of claim 5, further comprising: fourth, fifth, and sixth display regions,
    wherein the fourth display region is disposed substantially in parallel with the first display region in the second direction, wherein the fifth display region is disposed substantially in parallel with the second display region in the second direction, and wherein the sixth display region is disposed substantially in parallel with the third display region in the second direction.

7. The laser crystallization system of claim 1, wherein the mother substrate is an eighth generation substrate having a width of about 2500 mm in the first direction, and a width of about 2200 mm in the second direction, and wherein each of the first, second, and third display regions has a size suitable for forming a 46 inch display apparatus.

8. The laser crystallization system of claim 7, further comprising: fourth, fifth, sixth, seventh, and eighth display regions,
    wherein the fourth display region is disposed substantially in parallel with the third display region in the first direction, wherein the fifth display region is disposed substantially in parallel with the first display region in the second direction, wherein the sixth display region is disposed substantially in parallel with the second display region in the second direction, wherein the seventh display region is disposed substantially in parallel with the third display region in the second direction, and wherein the eighth display region is disposed substantially in parallel with the fourth display region in the second direction.

9. The laser crystallization system of claim 1, wherein a gap between the first laser irradiation unit and the second laser irradiation unit is maintained while a plurality of crystallization processes are performed.

10. The laser crystallization system of claim 1, wherein each of the first, second, and third display regions corresponds to a display apparatus configured to display an image.

11. The laser crystallization system of claim 1, wherein the second display region is interposed between the first and third display regions, wherein neither of the first and second laser irradiation units is configured to irradiate the first or second laser beam onto the second display region while irradiating the first and second laser beams to the first and third display regions.

* * * * *